(12) United States Patent
Ripley et al.

(10) Patent No.: US 8,611,836 B2
(45) Date of Patent: Dec. 17, 2013

(54) AMPLIFIER GAIN ADJUSTMENT IN RESPONSE TO REDUCED SUPPLY VOLTAGE

(75) Inventors: David S. Ripley, Marion, IA (US); Phil Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 138 days.

(21) Appl. No.: 12/807,041

(22) Filed: Aug. 25, 2010

(65) Prior Publication Data
US 2012/0049961 A1  Mar. 1, 2012

(51) Int. Cl.
*H04B 1/04* (2006.01)

(52) U.S. Cl.
USPC ..................... 455/127.2; 455/343.5

(58) Field of Classification Search
USPC .......... 455/67.11, 115.1, 127.1, 127.2, 127.5, 455/572, 574; 330/254, 278, 127, 133
See application file for complete search history.

(56) References Cited

U.S. PATENT DOCUMENTS

| | | | |
|---|---|---|---|
| 4,345,214 A * | 8/1982 | Harford | ........................ 330/254 |
| 5,337,006 A | 8/1994 | Miyazaki | |
| 6,178,313 B1 | 1/2001 | Mages et al. | |
| 6,496,061 B1 | 12/2002 | Bloom et al. | |
| 7,116,949 B2 * | 10/2006 | Irie et al. | ........................ 455/118 |
| 7,170,350 B2 | 1/2007 | Ryynänen et al. | |
| 7,184,722 B1 | 2/2007 | Johnson et al. | |
| 7,499,508 B2 | 3/2009 | Sayeed | |
| 7,714,654 B2 | 5/2010 | Ryynänen et al. | |
| 7,795,967 B2 | 9/2010 | Nakai et al. | |
| 2003/0040343 A1 | 2/2003 | Epperson et al. | |
| 2003/0218386 A1 | 11/2003 | Dalke et al. | |
| 2007/0077907 A1* | 4/2007 | Rector | ........................ 455/323 |
| 2008/0139146 A1* | 6/2008 | Behzad | ........................ 455/127.2 |
| 2009/0029659 A1* | 1/2009 | Gonzalez | ........................ 455/127.1 |
| 2009/0270137 A1 | 10/2009 | Sorensen et al. | |

* cited by examiner

*Primary Examiner* — Blane J Jackson
(74) *Attorney, Agent, or Firm* — Weide & Miller, Ltd.

(57) ABSTRACT

A power amplifier gain control system that monitors power supply voltage and changes the gain of the amplifier in response to changes in supply voltage. In systems subject to changes in supply voltage, such as in a battery powered system, the supply voltage can change over time. Reductions in the supply voltage may force the amplifier out of linear operation. A detector circuit compares the supply voltage in relation to one or more threshold values to determine if the supply voltage is less than a minimum nominal voltage. In response to the supply voltage falling below the minimal nominal voltage, amplifier gain is reduced to maintain amplifier linearity. A second threshold may be utilized in the comparison to the supply voltage when transitioning to the original gain level to prevent oscillation. A latching may be provided to prevent gain changes during active transmit periods.

32 Claims, 6 Drawing Sheets

AMPLIFIER GAIN ADJUSTMENT IN RESPONSE TO REDUCED SUPPLY VOLTAGE

FIELD OF THE INVENTION

The invention relates to amplifiers and in particular to a method and apparatus for improving amplifier efficiency and linearity in response to reduced supply voltage conditions.

RELATED ART

Power amplifiers are commonly utilized within portable communication devices to amplify an outgoing signal from a low power level to a higher power level suitable for transmitting a signal over a wireless channel. As is generally understood, in battery-powered devices, the power amplifier is powered directly from a battery. Over time, as the electronic device draws current from the battery, the supply voltage from the battery will drop. This in turn presents challenges for the electronic system forced to operate using supply voltages that change over time.

In the prior art GSM (Global System for Mobile communications) and GPRS (General Packet Radio Service) power amplifier designs, the type of modulation type used (e.g., Gaussian Minimum-Shift Keying or GMSK) to modulate an RF signal to be amplified allows the amplifier to operate in a saturated (non-linear) mode and the load impedance presented to the amplifier is selected to provide a target output power at a nominal power supply voltage. As such and while the amplifier works efficiently in the saturated mode, the output power may degrade at lower supply voltages but the degradation does not generally affect the quality of the signal, just the power thereof. However, a prior art EDGE (Enhanced Data rates for GSM Evolution) power amplifier must operate in a linear mode because of modulation type used by EDGE (e.g., phase-shift keying). As such, an approximately 1.3 dB of power output margin is added to the amplifier output power capability to support operation at minimum supply voltage. Thus, when the supply voltage decreases, causing the maximum output power to likewise decrease, the added margin allows the amplifier to operate sufficiently linearly and prevents the output signal from failing to meet certain signal quality requirements. For example, the battery voltage may drop to 3 volts, relative to a nominal battery voltage of 3.5 volts (1.3 dB=20*log(3.5/3.0)), thus 1.3 dB of power output margin is required to maintaining amplifier linearity at low battery voltages.

While the added output power margin approach does maintain linearity, it suffers from several drawbacks. One such drawback is that when the 1.3 dB of margin is added to the output power capability for all supply voltage levels, the power efficiency of the amplifier is degraded when supply voltage is at nominal levels. This reduction in efficiency results in increased current consumption and reduced battery life.

Another proposed approach is to implement a feedback loop with an RF signal detector such that the detector monitors and reports the power of the RF signal output from the amplifier. This proposed approach then modifies the detector response based on the supply voltage. At low power supply voltage conditions, the detector's output voltage is set to indicate a level 1 dB greater than the actual power level which in turn causes the control loop to reduce input power to the amplifier to thereby reduce the output power by 1 dB. This power reduction reduces clipping and non-linearity. However, while this prior art approach improves linearity, it is undesirably complex and it requires a detector that increases cost and size of the solution.

As a result, there is a need in the art for a cost effective solution that improves power efficiency and reduces complexity for a power amplifier presented with a supply voltage below a nominal voltage or a nominal voltage range.

SUMMARY

To overcome the drawbacks of the prior art, a method and apparatus is disclosed for monitoring supply voltage and in response to a reduced supply voltage, decreasing gain of an amplifier.

In one embodiment, a method comprises monitoring a supply voltage presented to an amplifier having a gain level, setting the gain level of the amplifier to a first gain level, and setting the gain level of the amplifier to a second gain level when the monitored supply voltage is less than a first threshold voltage. The first gain level is greater than the second gain level.

One example environment of use is in a communication system. The communication system comprises a transceiver configured to generate an RF signal, a battery configured to provide a supply voltage, an amplifier, and a detector. The amplifier has a gain level, the gain level setting the amplification by the amplifier of the RF signal, to create an amplified RF signal for transmission by an antenna. The detector is adapted to monitor the supply voltage or a voltage derived from the supply voltage. The amplifier is adapted to change, in response to the detector, the gain level of the amplifier of the from a first gain level to a second gain level when the detector determines that the supply voltage is less than a first threshold voltage, the second gain level being less than the first gain level.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

In an attempt to overcome the drawbacks of the prior art and provide additional benefits, a power amplifier having adjustable gain is disclosed. In one or more embodiments, the gain of the amplifier is adjusted in response to the supply voltage to the amplifier, thereby maintaining linear operation of the amplifier when operating with a reduced supply voltage while also maintaining high efficiency during periods of nominal supply voltage. This solution is useful in battery-powered applications, such as in a battery-operated mobile telephone handset, to improve power amplifier operation with changes in battery voltage. Such mobile telephone applications may operate in accordance with GSM and EDGE standards or any other standard. This solution improves efficiency over prior art linear power amplifier designs while also maintaining compliance with certain signal quality requirements, such as ACPR (adjacent channel power ratio) and EVM (error vector magnitude) requirements in the EDGE standard over wide power supply operating ranges. Unlike prior art amplifier designs which added significant output power margin for all supply voltages and thereby operate with reduced efficiency, this disclosed solution does not suffer significantly from such drawbacks. In addition, the complexity, cost and space consumed by detectors paired to feedback loops may be avoided with this solution.

Figure 1:
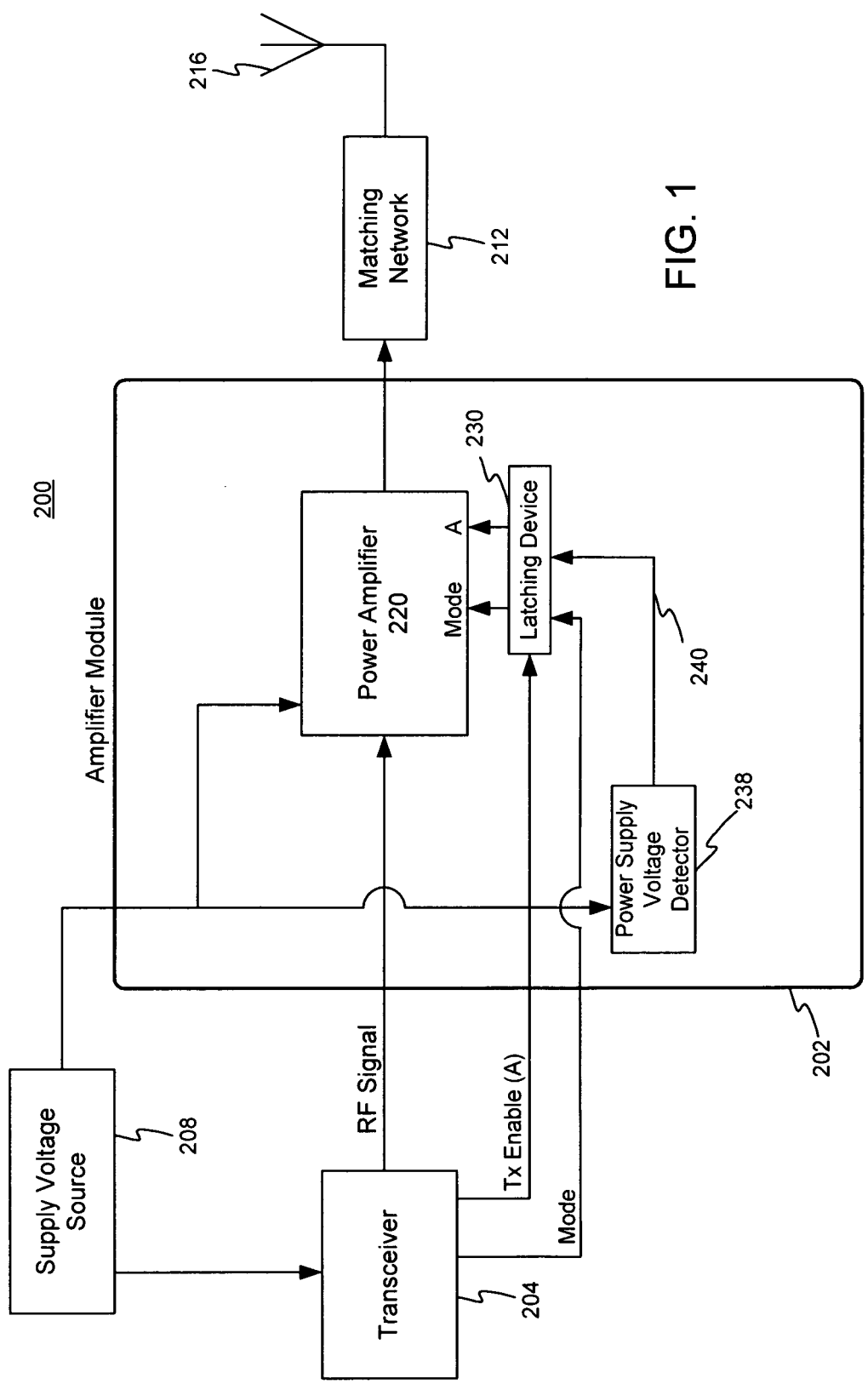
FIG. 1 is a block diagram of an exemplary embodiment of a transmit chain in a mobile handset or the like, according to one embodiment of the present invention.

FIG. 1 is a block diagram of an exemplary embodiment of a transmit chain 200 for a mobile handset or the like, having a power amplifier with settable gain dependent on the power supply voltage. This is but one possible example embodiment and as such, one of ordinary skill in the art may develop variations on this design after reviewing the following disclosure. This embodiment includes an amplifier module 202, includes a power amplifier 220, configured to amplify an RF signal for eventual transmission. A conventional transceiver 204, such as a PMB 6272 CMOS transceiver available from Infineon Technologies AG of Munich, Germany, provides the RF signal to the amplifier module 202. The transceiver 204 may comprise a control system configured to control transmission of an outgoing signal, a receiver system configured to receive and processing an incoming signal, and control circuitry, such as a microprocessor or digital signal processor along with software stored in a non-transient machine-readable medium, to control the overall operation of the mobile handset. A supply voltage source 208 provides power to the amplifier module 202 and the transceiver 204 as shown. It is contemplated that the supply voltage source 208 comprises a battery, but in other embodiments the supply voltage source could comprise a fuel cell, solar voltage source, capacitor, or any other voltage source. The voltage provided by the supply voltage source 208 will vary over time from a nominal voltage level or range when fully charged, to a voltage level below a minimum nominal voltage as current is drawn from the source.

The output of the amplifier module 202 feeds into a conventional matching network 212, which in turn connects to a hybrid (not shown) or directly to an antenna 216. The matching network 212 performs impedance matching between the amplifier module 202 and the antenna 216.

The amplifier module 202 comprises one or more amplifiers 220 configured to amplify the RF signal from the transceiver 204. The amplifier 220 also receives control signals from a latching device 230. As will be explained in more detail below, the control signals set the gain of the amplifier stages 220 and the latching device 230 holds the control signals constant during transmit periods.

The amplifier module 202 includes a power supply voltage detector 238, responsive to the voltage from source 208, which generates a control signal coupled to the amplifier stages 220. As will be explained in connection with FIG. 3, the detector 238 includes circuitry that provides a comparator with hysteresis to prevent oscillation or "hunting" by the detector as voltage from supply 208 varies. The detector 238 determines whether the voltage from the power supply 208 is within a nominal voltage range or below nominal and, in response, generates the control signal that sets the gain of the amplifier stages 220. Simply put, if the supply voltage is below a first threshold level, the voltage from the supply 208 is less than a minimum nominal voltage and the control signal from detector 238 reduces the gain of the amplifier stages 220 from a first gain level to a second gain level. Should the voltage of supply 208 subsequently exceed a second threshold voltage greater than the first threshold voltage, the voltage from the supply 208 is again nominal and the control signal from the detector 238 returns the gain of the amplifier stages 220 to the first gain level. It is contemplated that more than two threshold voltages and gain levels may be used as desired.

While the detector 238 is analog in this embodiment, it is understood that the power supply voltage detection by the detector 238 may occur in the analog or digital domain. If embodied in a digital domain, then the typically analog supply voltage may be sampled and converted to digital format by an analog-to-digital converter (not shown). One or more digital threshold values stored in a memory, either external or internal to the transceiver 204, would be compared to the supply voltage by a processor within the transceiver 204.

The latching device 230 is present to prevent changes in gain during transmit periods. In one embodiment, the transmit chain 200 operates in burst mode such that transmission occurs only during transmit periods. The latching device 230 receives one or more gain control signals from the detector 238 (240) and transceiver 204 (Mode) and a transmit enable signal (Tx Enable) from the transmit chain 200, such as but not limited the transceiver 204. The transmit enable signal may comprise any signal that indicates when the system is transmitting. The transmit enable signal controls the latching device 230 to prevent a change in gain when the system is transmitting. Changes in the gain of the amplifier 220 during transmission may cause the amplified signal from the amplifier 220 to exceed one or more of the above-identified ACPR or EVM requirements. In another embodiment, the output 240 from the detector 238 and transceiver 204 (Mode) may feed directly into the amplifier 220. In one embodiment, the latching device 230 comprises one or more flip-flops.

As will be explained in more detail below, the amplifier 220 may operate in a saturated (non-linear) mode or linear mode. For GSM operation, the amplifier stages 220 are operated in the saturated mode and no adjustment to the amplifier gain with power supply voltage is required. However, the EDGE standard requires that the amplifier operate as a linear amplifier to meet the ACPR and EVM requirements. For high efficiency in the saturated mode, in the embodiment describe here, it is advantageous for the amplifier 220 operate with a higher gain than when operated in the linear mode. Thus, in this embodiment, a MODE control signal, from the transceiver 204, sets the gain of the amplifier depending on whether the transmit chain 200 is operating in the EDGE or GSM mode. When operating in the EDGE mode, the gain of the amplifier 220 is set by the control signal from detector 238 coupled to input A.

Figure 2:
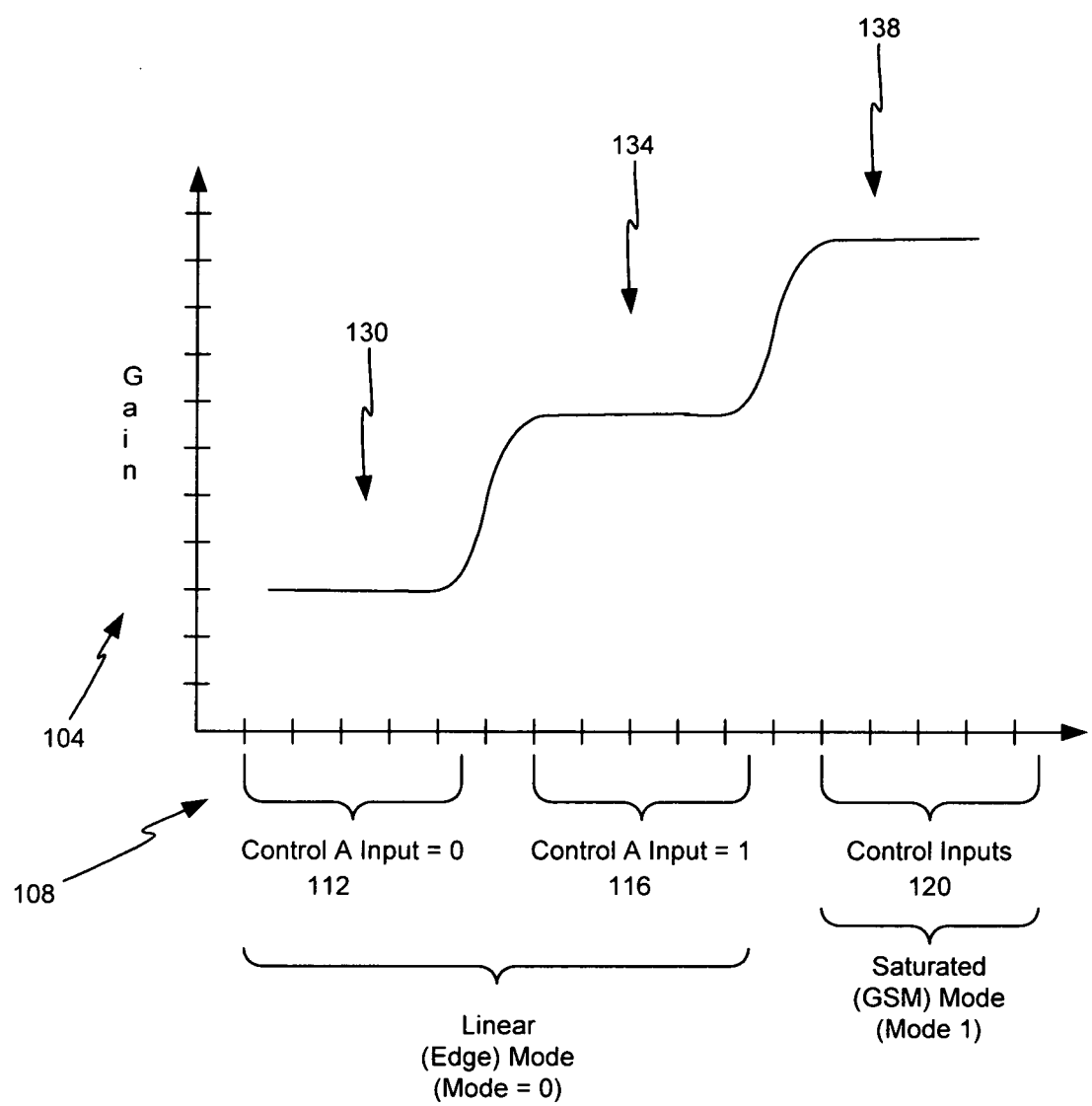
FIG. 2 is an exemplary plot of amplifier gain in relation to control inputs.

FIG. 2 is illustrates an exemplary plot of gain of the amplifier 220 based on the control inputs MODE and A. This is but one exemplary plot and is provided to show a relationship between exemplary control inputs and gain. It is contemplated that in other embodiments or when other aspects of the system are considered, additional gain steps may be available to account for other system capabilities. In this example plot, gain is shown on the vertical axis 104 while the control input values are shown on the horizontal axis 108. In this exemplary embodiment, there are two modes of operation: linear and saturated. In the linear mode (MODE=0), the control input configurations shown include control input A=0 (112) and control input A=1 (116). In the saturated mode (MODE=1) (gain control signal configuration 120), the control input A has no effect on gain. In particular, for gain control signal configuration 112, a first gain level 130 is established at the output of an amplifier module. This represents the lowest gain level for the amplifier 220. For gain control signal configuration 116, a second gain level 134 is established. This is an intermediate gain level. For the gain control signal configuration 120, a third gain level 138 is established. This represents the highest gain level for the amplifier 220. In one embodiment, these gain levels correspond to gains of about 33 dB, 34 dB, and 40 dB respectively. In other embodiments other gain levels or steps may be established. As discussed below in greater detail, changing the gain occurs in response to changes in supply voltage during operation in the linear mode, and may occur in response to operating mode depending on the communication standard (e.g., GSM or EDGE) or modulation type in use.

Figure 3:
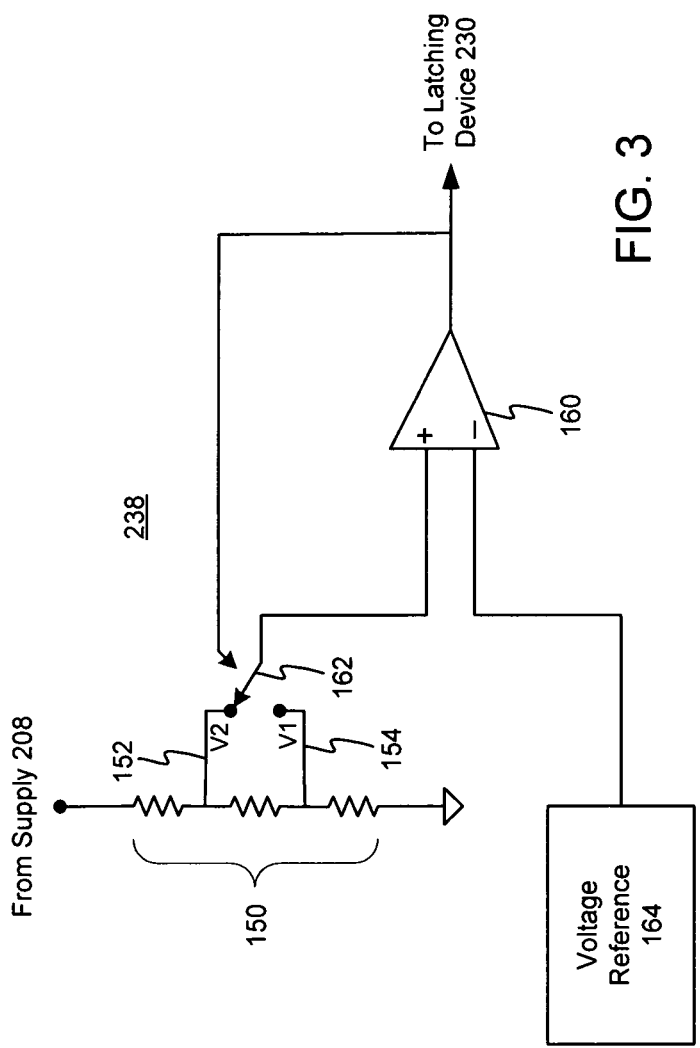
FIG. 3 is an exemplary circuit diagram of a comparator having hysteresis.

In FIG. 3, an exemplary embodiment of the detector 238 (FIG. 1) is diagrammed. Voltage from the power source 208 (FIG. 2) is fractionally scaled by resistor string 150. Taps 152, 154 along string 150 provide two voltages, $V_2$ and $V_1$, respectively, for coupling to the non-inverting input of comparator 160 via a single pole, double throw switch 162. As will be described in more detail below, switch 162 may be implemented using one of many well-known designs, such as using two conventional CMOS transmission gates controlled by the output of comparator 160. The two taps 152, 154 and the comparator-controlled switch 162 provides the above-described hysteresis for detector 238. A voltage reference 164, such as a conventional bandgap voltage reference that generates a voltage substantially invariant with temperature, e.g., 1.2 volts, is coupled to the inverting input of the comparator 160. Assuming that the voltage from the supply 208 is sufficient that the voltages at both taps 152, 154 are greater than the voltage from reference 164 (i.e., the supply voltage is nominal), the output of the comparator is a "1", configuring the switch 162 such that the non-inverting input of the comparator 160 is coupled to tap 154. Should the voltage $V_1$ at tap 154 fall to less than the voltage from reference 164, the output of the comparator 160 goes to a "0" and configuring the switch 162 to couple the non-inverting input of comparator 160 to tap 152. The output of comparator 160 will not return to a "1" until the voltage $V_2$ on tap 152, being less than the voltage $V_1$, exceeds the reference voltage. Thus, hysteresis is added to the operation of the comparator 160. It is understood that alternative techniques may be used to implement the detector 238.

The voltage of the supply 208 which will cause the comparator to switch from a "1" to a "0" and from a "0" to a "1" is easily designed by someone with ordinary skill in the art. For purposes here, the supply voltage that will cause a change in the output of comparator 160 from a "1" to a "0" is a first threshold voltage, and the supply voltage that will cause a change in the output from a "0" to a "1" is a second threshold voltage. As used herein, the term nominal voltage is defined as the voltage resulting from a fully charged voltage source. The minimum nominal voltage is a voltage level that will result in the output signal quality from the amplifier 220 just meeting a target level. Voltages below the minimum nominal voltage are defined as voltages that will result in the output signal quality dropping below a target level. The output signal quality target level is defined as a level that causes the quality of the output signal from the amplifier 220 to meet a system's IP3 (third-order intercept point), ACPR (adjacent channel power ratio), EVM (error vector magnitude), and ORFS (Output RF Spectrum) specifications. Other specifications may be added or one or more of the above-identified specifications dropped, as required.

In one embodiment, for typical Li-ion or Ni-metal-hydride rechargeable batteries, the voltage levels for the supply voltage is between approximately 3 volts and 4.8 volts, the nominal supply being approximately 3.5 volts. Thus, the first threshold voltage is set to approximately 3.3 volts and the second threshold voltage is set to approximately 3.5 volts. In other embodiments or for different technologies (such as Ni—Cd rechargeable batteries or non-rechargeable alkaline batteries), the first and second threshold voltages may be different.

Returning to FIG. 1, if the transceiver 204 is configured to operate in, for example, the GSM mode, then the MODE control signal is set to a "1" and, as shown in FIG. 2, the gain of the amplifier 220 is at a maximum gain level 138. In this embodiment, the control signal A has no effect on the amplifier gain but it is understood that alternative embodiments may have additional controls signals, including control signal A, setting the gain of the amplifier when operated in the saturated mode.

If, however, the transceiver 204 is configured to operate in, for example, the EDGE mode, then the MODE control signal is set to a "0" and the control input A has an effect of setting the gain of the amplifier 204. In the case where the power supply voltage meets or exceeds the minimum nominal supply voltage, the amplifier 220 operates at or near maximum efficiency due to the supply voltage being within the nominal voltage range and the amplifier and the amplifier configured to operate at maximum power for these supply voltages.

To achieve improved efficiency and linearity at various power supply voltages, the detector 238 operates to monitor the supply voltage and, in accordance with the supply voltage, adjusts the gain of the amplifier 220 through control signal A. The latching device 230 presents this gain control signal A to the amplifier stage 220 during the next non-transmit period, i.e. when the transmitter is not transmitting. The latching device 230 maintains the same gain control signal value to the amplifier 220 until the latching device 230 is presented with a different gain control signal value and the transmit enable signal (Tx Enable) is a "0" or other logic level indicating the system is not transmitting. In other embodiments, the system may be configured to change gain during a transmit period.

Over time the supply voltage will drop until the supply voltage reaches a level below the minimum nominal supply voltage. The detector 238 continues to monitor and compare the supply voltage to the first threshold and eventually detects the drop of the supply voltage below the first threshold. The first threshold is a threshold value representing a voltage that is a minimum nominal voltage that the detector 238 forces the amplifier 220 to a reduced gain, referred to herein as a second gain level. In one configuration, the gain reduction is 1 dB, but in other embodiments gain reductions of different amounts may occur. Thus, the detector 238 outputs the result of the comparison indicating the drop in supply voltage below the first threshold to the latch 230 which, as described above, changes the control input A of the amplifier 220. The output signal may comprise a change in logic levels or any other type signal.

Operation continues at this reduced gain level while the detector 238 continues to monitor the supply voltage in relation to the one or more thresholds. During operation at the second or reduced gain level, it is contemplated that the supply voltage may increase back to a nominal supply voltage range. This may occur for any number of reasons including change in temperature, reduction in current draw from the battery, or a battery charging session. To reduce unwanted oscillation between gain levels, it is desirable to add hysteresis to the operation of detector 238. In this embodiment, when operating at the second gain level, the detector 238 monitors the supply voltage in relation to a second threshold value, which in this embodiment is greater than the first threshold value. Because the second threshold value is greater than the first threshold value, the supply voltage must increase in value to a voltage greater than the first threshold value before the control signal A will transition, setting the gain of the amplifier 220 from the second gain level back to the first gain level. This differential between the first and second thresholds, referred to as hysteresis, prevents unwanted oscillation or hunting between gain levels.

Should the detector 238 determine the supply voltage is greater than the second threshold value, the detector outputs forces the amplifier 220 to operate at the first gain level instead of the second gain level via the latching device 230 at the next period when the transmitter is not transmitting. Operation continues in this manner.

By reducing the gain of the amplifier 220, the swing of the output stage, i.e., the peak-to-peak voltage on an output node (e.g., a collector or drain) of a transistor in the final stage of the amplifier 220 is concomitantly reduced, which in turn reduces clipping and distortion by the amplifier 220. Reducing clipping and distortion improves linearity. When the amplifier 220 comprises a series of stages that are cascaded, the output power is controlled by the input power to the module 202 from transceiver 204 and the gain of the amplifier 220. Output power is proportional to input power in a linear power amplifier. Therefore reducing the gain of the amplifier 220 reduces the power and the voltage swing of the signal on the output stage. Severe degradation in linearity occurs when the voltage waveform on the output stage is limited by the supply voltage, causing distortion. For an EDGE system this distortion will cause in the amplifier 220 to fail the above-described ACPR and EVM requirements. Reducing the voltage swing reduces this phenomenon and preserves the linearity.

The system of FIG. 1 has several advantages as compared to the prior art. One such advantage is that this solution is autonomous and as such does not require complex interaction with the transmit chain 200. As discussed above, it does not require a closed-loop control and may be implemented without modification to operating software.

Figure 4:
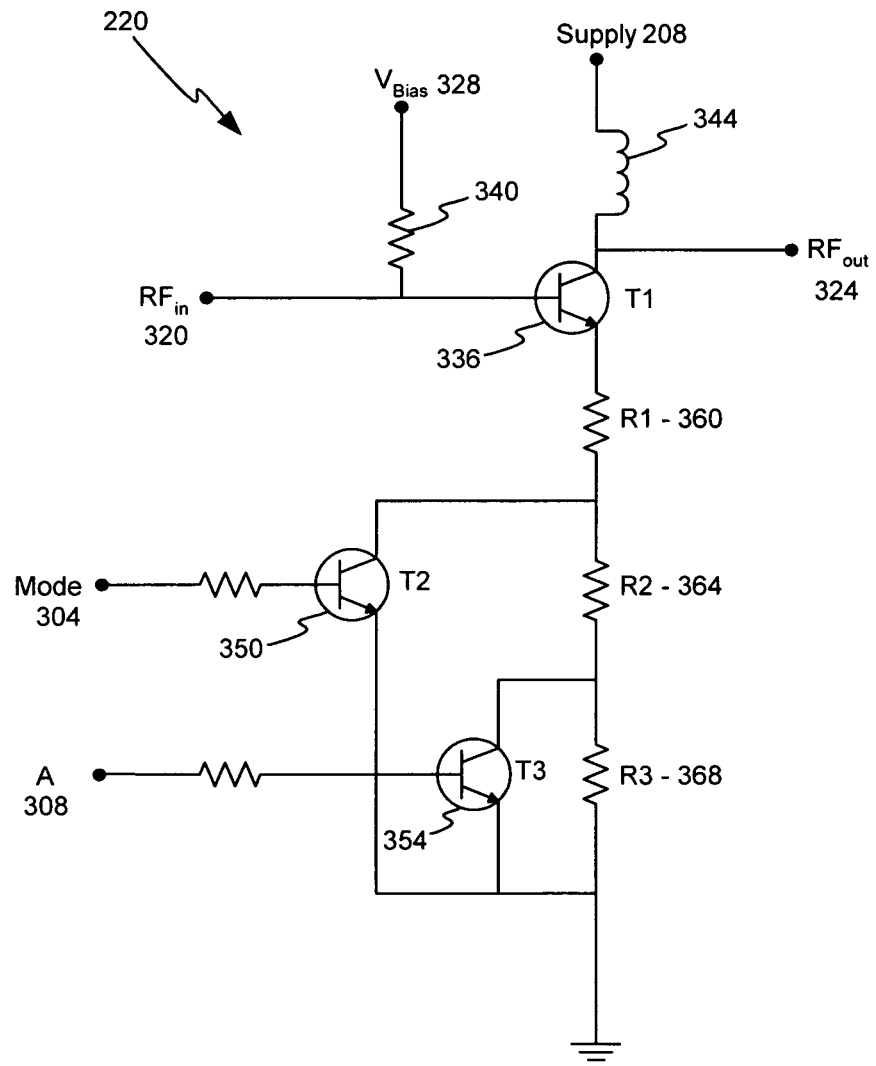
FIG. 4 is an exemplary circuit diagram of an RF amplifier with gain control inputs according to one embodiment of the invention.

FIG. 4 is a circuit level diagram of an exemplary RF power amplifier 220 with gain control inputs. This is but one possible circuit level implementation. In this exemplary circuit, the signals presented to MODE control input 304 and control input A 308 represent the gain control signals shown in FIGS. 1 and 2. This exemplary embodiment has three different gain levels but more than three gain levels may be achieved by modifying the amplifier 220 circuit in FIG. 4 in one of many well-known ways. In one embodiment, a first gain level is established for linear operation with nominal supply voltage while a second gain level is established for linear operation with a reduced supply voltage, and a third gain level for a saturated mode operation. This exemplary circuit is now discussed element by element.

The RF input 320 presents the RF signal to the amplifier circuit for amplification. The RF signal input connects to an amplifier transistor 336, here a bipolar transistor. A bias voltage 328, through bias resistor 340, biases the transistor 336. In this example, the bias voltage is fixed but it is understood that other bias arrangements, including variable bias, may be used. The transistor receives a supply voltage 330 through RF choke 344 comprising an inductor. The RF choke 344, providing a high impedance to an RF signal on the collector of transistor, decouples the collector of transistor 336 from the supply voltage 330 while allowing DC current to pass to the transistor 336. The output of the transistor 336 is presented to an RF output 324. In one embodiment the signal on the RF input 320 is held constant while gain is modified.

The emitter of the transistor 336 connects to the series-connected resistors 360, resistor 364, and resistor 368 to ground as shown. The resistors 360, 364, 368 act as emitter degeneration resistors used to control the gain of the transistor 336 such that as the resistance is increased, the gain of the transistor 336 and, hence, amplifier 220, is reduced. In parallel with resistor 368 is a switching transistor 354 having a base connected to the control input A 308. In this embodiment, presenting a logic "1" signal on the input A 308 forces the transistor 354 into conduction mode, thereby effectively removing the resistor 368 from the emitter to ground path for transistor 336 which in turn reduces the emitter degeneration resistance and increases the gain of the amplifier 220.

Likewise, in parallel with resistor 368 and resistor 364 is a switching transistor 350 having a base connected to the input MODE 304. In this embodiment, presenting a logical "1" signal on the input MODE 304 forces the transistor 350 into conduction mode thereby effectively removing the resistors 368, 364 from the emitter to ground path which in turn reduces the emitter degeneration resistance, thereby increasing the gain of the amplifier 220 to its maximum. In this embodiment, the transistors 350, 354 are bipolar devices configured as switches that may be toggled between open and short circuits based on the logic signals presented to the base of the transistor 350, 354. Alternatively, MOSFET devices or electromechanical devices (e.g., relays) may be used instead of bipolar transistors 350, 354.

In this example embodiment, the input A 308 receives a control signal that controls gain in response to the supply voltage level from detector 238 (FIG. 2). The MODE input receives a control signal that sets a different gain level for operation in GSM or EDGE communication standards or the like, respectively. However, it is contemplated that in other embodiments the MODE input may be omitted. Alternatively, the input A may establish different gain steps in response to different supply voltage levels to thereby create a greater degree of gain resolution responsive to different degrees of supply voltage variation. The following discussion is presented with MODE controlling operation in GSM or EDGE, which each having different operating modes and, thus, different gain requirements. Although establishing MODE at a logic "1" level eliminates the gain control by the A control input from the circuit, in this embodiment GSM operation does not utilize the gain step so when operating in GSM, the gain step is not needed. In other embodiments, operation in GSM may benefit from a gain step and as such in these alternative embodiments the MODE input could be used to establish operation in the GSM mode or the EDGE mode, thereby leaving the control input A for the gain adjustment for both modes.

In operation, the RF signal is presented to the base of transistor 336, which amplifies the RF signal based on the supply voltage 208 and the degeneration resistance in series with the emitter of transistor 336. During operation, a signal presented on the MODE input 304 is determined by whether the system is in GSM or EDGE mode and as such the MODE input may receive a logic "1" or "0" signal, respectively.

The input A 308, coupled to the detector 238 in FIG. 1, is presented with a logic "1" level signal during nominal supply voltage range. This in turn forces transistor 354 to appear as a short circuit. This effectively removes the resistance of resistor 368 as part of the emitter degeneration resistance, which provides for a higher gain by transistor 336, compared to the gain with the resistor 368 being part of the circuit.

Operation continues in this manner until the system detects that the supply voltage has dropped out of the nominal voltage range. When the supply voltage drops below the minimum nominal voltage, a logic "0" level is presented on the input A. This forces the transistor 354 to appear as an open between the collector and emitter terminals thereof. This effectively places the resistor 368 into the circuit thereby increasing the emitter resistance. This, in turn, decreases gain, which has the effect of reducing clipping and improving linearity during period of reduced supply voltage. Thereafter, the input A may transition between a logic "1" level or a logic "0" level depending on the supply voltage value and its relation to the first threshold voltage and the second threshold voltage. Hysteresis control is present to prevent oscillation as discussed in connection with FIGS. 1 and 3.

In an alternative embodiment, instead of varying the gain of the amplifier 220 by changing one or more component values in the amplifier, amplifier stages with different gains may be substituted or switched in and out of the amplifier 220 depending on the supply voltage as monitored by detector 238. For example, for normal supply voltages, an amplifier stage with a high gain is used in amplifier 220. However, should the supply voltage falls below the first threshold voltage, a low-gain amplifier stage is substituted for the high-gain amplifier. A suitable technique for substituting amplifier stages with different gains is disclosed in U.S. Pat. No. 7,482,868, incorporated herein by reference in its entirety.

It is also contemplated that a FET or other similar devices may be substituted for the bipolar transistor 336. Operation with a FET instead of the bipolar transistor 336 would occur substantially as described above but with the resistors 360, 364, 368 operating as source degeneration resistors that operate similarly to that described for the bipolar version.

Figure 5:
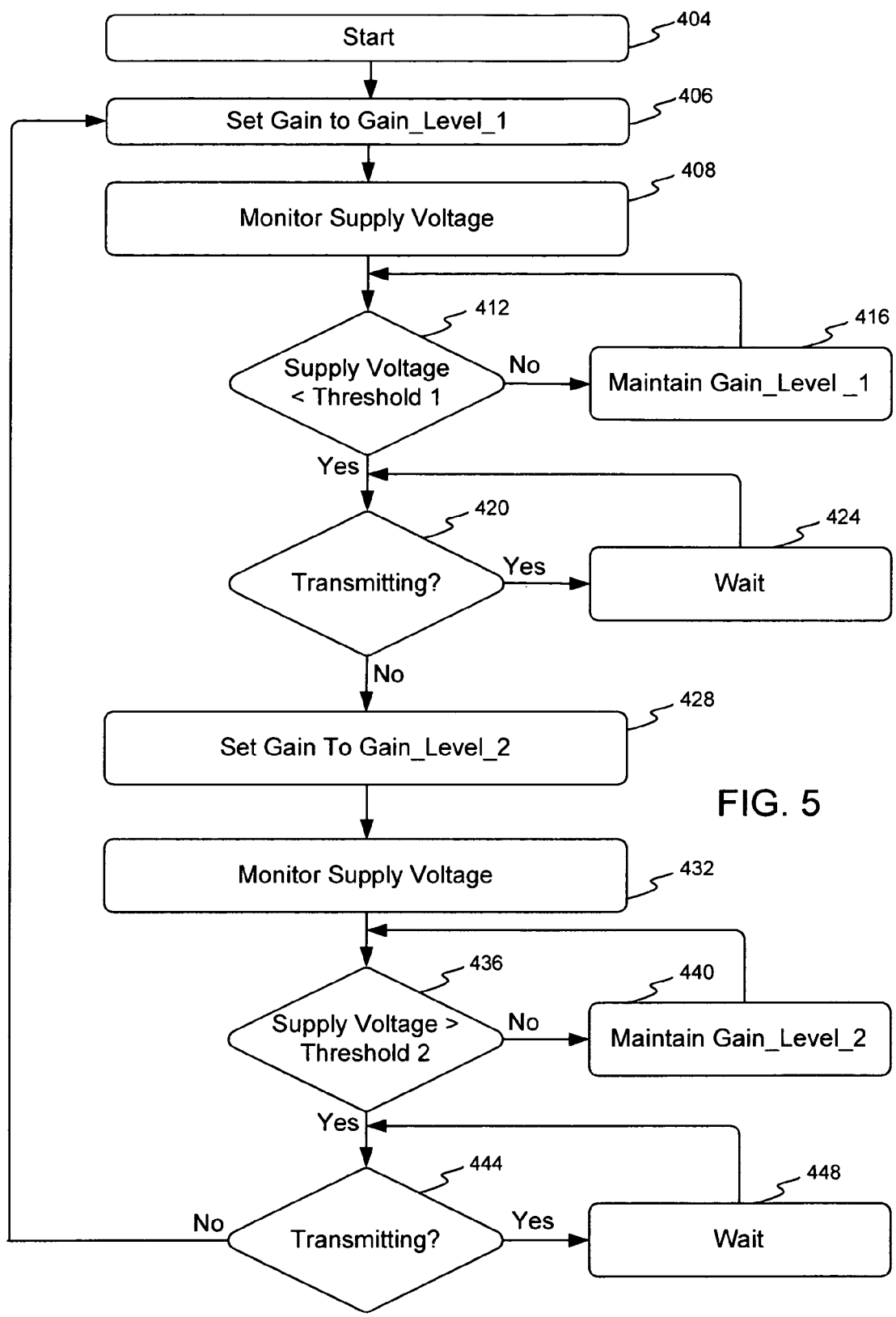
FIG. 5 is an exemplary operational flow diagram of the operation of an exemplary embodiment of the invention.

FIG. 5 is an exemplary operational flow diagram of an example method of operation of the amplifier module 200 (FIG. 2) when configured for linear (MODE=0) amplification. This is but one possible method of operation and as such it is contemplated that in other embodiments other methods of operation may occur without departing from the claims that follow. In the following example, it is assumed that the power supply is positive and that the first threshold value is somewhat less positive than the second threshold value to provide the above-described hysteresis; persons with ordinary skill in the art can adapt the circuits and functionality described herein for negative power supply voltages. If the amplifier module 200 is configured for saturated, non-linear amplification (MODE=1), then the following steps may be skipped.

In this embodiment, the operation starts at step 404. First, the gain of the amplifier is set initially to Gain_Level_1 in step 406. Thereafter, the operation advances to step 408 and the system monitors the supply voltage. The voltage from supply 208 may be monitored directly, or a scaled version, such as from a divider network, may be monitored as part of this process. Based on the monitoring, the operation advances to a decision step 412. At decision step 412, the operation determines if the supply voltage is less than the first threshold. By comparing the supply voltage to the first threshold, the operation determines if the supply voltage is in the nominal voltage range or below the nominal range. Based on the comparison, the gain level of the amplifier 220 may be adjusted to maintain linearity at low supply voltage. If at decision step 412 the supply voltage is not less than the first threshold, i.e., the supply voltage is above a minimum nominal voltage, then the operation advances to step 416 and the existing gain level is maintained, in this embodiment at Gain_Level_1, and the operation returns as shown to the decision step 412.

Alternatively if at decision step 412 the operation determines that the supply voltage is less than the first threshold, i.e., the supply voltage is below the minimum nominal voltage, then the operation advances to step 420. At step 420 the operation determines if the system is transmitting data. In this embodiment, it is undesirably to change the gain level if the system is transmitting data. If the system is transmitting, then the operation advances to step 424 and the system enters a short wait cycle, before returning to step 424. If instead at step 420 the operation determines that the system is not transmitting, then the operation advances to step 428 and the system implements Gain_Level_2. In this embodiment the Gain_Level_2 establishes a lower gain level in amplifier 220 than Gain_Level_1 in response to a lower supply voltage. This has the effect or reducing clipping and thereby maintaining linearity of the amplifier 220. Operation continues at this gain level as described below.

At a step 432, the system continues to monitor the supply voltage in relation to a second threshold where the second threshold is different from the first threshold. If the supply voltage is not greater than the second threshold then the operation advances to step 440 and the system maintains Gain_Level_2. This occurs because the supply voltage is still below nominal voltage range and below the second threshold. Although the supply voltage may have increased beyond the first threshold value, it has not yet increased beyond the second threshold. Accordingly, the operation returns to step 436 as shown and the same gain level is maintained until at step 436 the supply voltage rises above the second threshold. If the supply voltage is greater than the second threshold, then the operation advances to a decision step 444 and the operation determines if the system is transmitting.

If the system is transmitting, then the operation advances to step 448 and it executes a wait cycle and then returns to decision step 444 as shown. As discussed above, the gain should not be changed during a transmit period. If at decision step 444 the system is not transmitting, then the operation advances to step 406 and the gain level of amplifier 220 is adjusted back to Gain_Level_1, which is the gain level for when supply voltage is in the nominal range. After step 406, the operation returns to step 408 and the system monitors the supply voltage.

Although described with in connection with a system having two thresholds in relation to supply voltage and two corresponding gain levels, it is contemplated that more then two thresholds may be established which in turn create more than two gain levels. This optional embodiment would create additional resolution in gain adjustment to match supply voltage. In addition, it is contemplated that the gain could change during a transmit period. Moreover, although two thresholds are utilized for a two gain level system, a single threshold could be utilized although oscillation could occur. Other means could be used to prevent oscillation, such as a timer or other delay.

Figure 6:
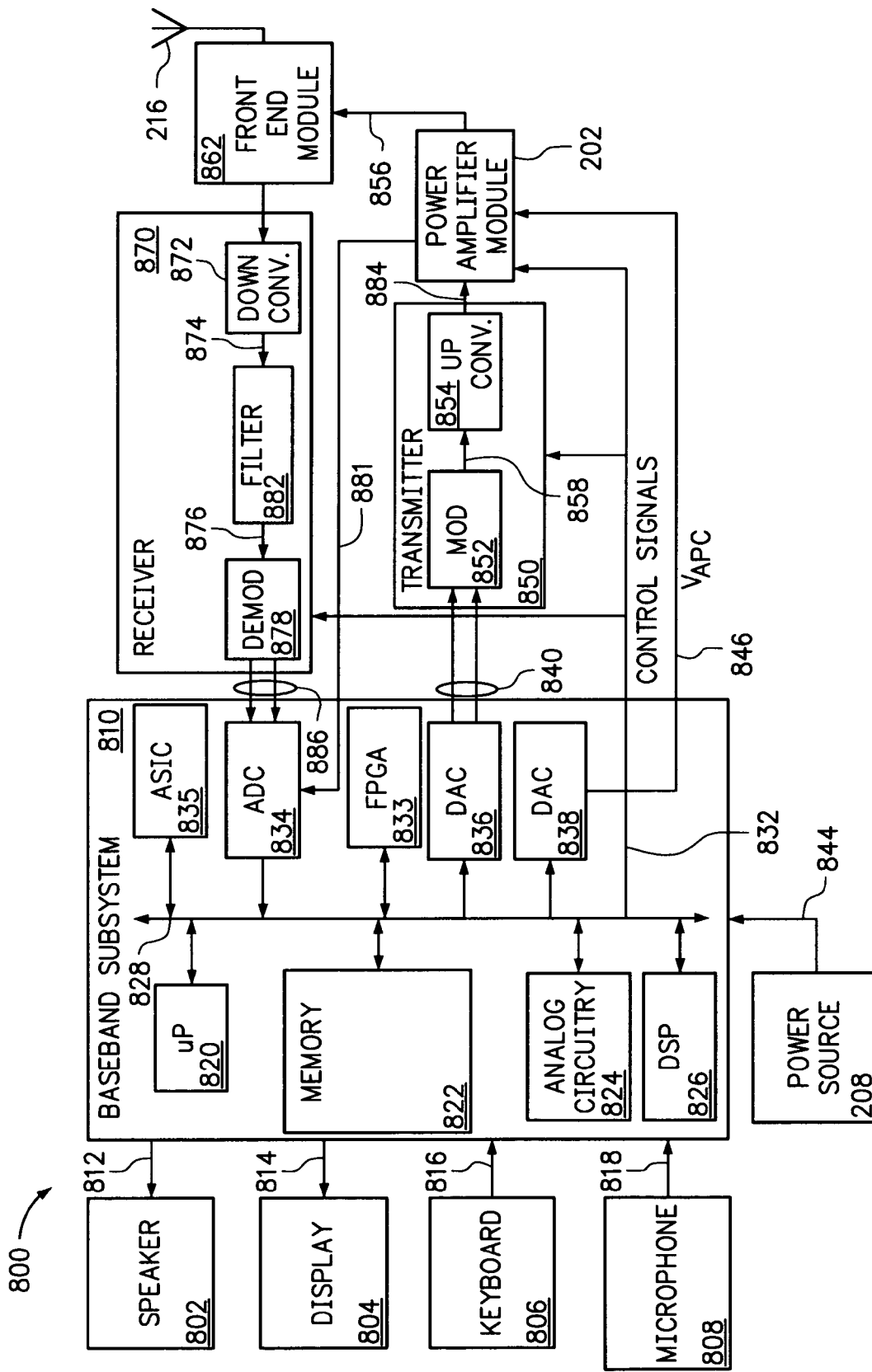
FIG. 6 illustrates an example environment of use comprising a portable transceiver.

FIG. 6 illustrates an example environment of use comprising an exemplary portable transceiver. This is one possible example environment of use of the innovation disclosed herein and as such, it is contemplated that the innovation may be used in many other environments. The portable transceiver 800 includes speaker 802, display 804, keyboard 806, and microphone 808, all connected to baseband subsystem 810. A power source 208, which may be a direct current (DC) battery or other power source, is also connected to the baseband subsystem 110 via connection 844 to provide power to the portable transceiver 800. In a particular embodiment, portable transceiver 800 can be, for example but not limited to, a portable telecommunication device such as a mobile cellular-type telephone. Speaker 802 and display 804 receive signals from baseband subsystem 810 via connections 812 and 814, respectively, as known to those skilled in the art. Similarly, keyboard 806 and microphone 808 supply signals to baseband subsystem 810 via connections 816 and 818, respectively. Baseband subsystem 810 includes microprocessor (.mu.P) 820, memory 822, analog circuitry 824, and digital signal processor (DSP) 826 in communication via bus 828. Bus 828, although shown as a single bus, may be implemented using multiple busses connected as necessary among the subsystems within baseband subsystem 810. The baseband subsystem 810 may also include an application specific integrated circuit (ASIC) 835 and a field programmable gate array FPGA) 833.

The microprocessor 820 and memory 822 provide the signal timing, processing and storage functions for portable transceiver 800. Analog circuitry 824 provides the analog processing functions for the signals within baseband subsystem 810. Baseband subsystem 810 provides control signals to transmitter 850, receiver 870 and the power amplifier module 202, such as through connection 832 for example.

The baseband subsystem 810 generates a power control signal, referred to herein as $V_{APC}$ that is supplied to the power amplifier module 202 via connection 846. The power amplifier module 202 may correspond to the amplifier module shown in FIG. 1. The signal $V_{APC}$ is generated by the baseband subsystem 810 and is generally converted to an analog control signal by one of the digital-to-analog converters (DACs) 836 or 838 to be described below. The power control signal $V_{APC}$ may also be supplied from the bus 828 to indicate that the signal may be generated in different ways as known to those skilled in the art. Generally, the power control signal, $V_{APC}$, is generated in the baseband subsystem 810 and controls the output of the power amplifier as a function of the peak voltage of the power amplifier determined during calibration, and corresponds to power amplifier output power.

The control signals on connections 832 and 846 may originate from the DSP 826, the ASIC 835, the FPGA 833, from microprocessor 820, or may be generated on the transmitter 850, the receiver 870 or on a transceiver chip, on which the transmitter 850 and receiver 870 are located, and are supplied to a variety of connections within the transmitter 850, receiver 870 and the power amplifier module 202. It should be noted that, for simplicity, only the basic components of the portable transceiver 800 are illustrated herein. The control signals provided by the baseband subsystem 810 control the various components within the portable transceiver 800. Further, the function of the transmitter 850 and the receiver 870 may be integrated into a transceiver.

Baseband subsystem 810 also includes analog-to-digital converter (ADC) 834 and digital-to-analog converters (DACs) 836 and 838. Although DACs 836 and 838 are illustrated as two separate devices, it is understood that a single digital-to-analog converter may be used that performs the function of DACs 836 and 838. ADC 834, DAC 836 and DAC 838 also communicate with microprocessor 820, memory 822, analog circuitry 824 and DSP 826 via bus 828. DAC 836 converts the digital communication information within baseband subsystem 810 into an analog signal for transmission to a modulator 852 via connection 840. Connection 840, while shown as two directed arrows, includes the information that is to be transmitted by the transmitter 850 after conversion from the digital domain to the analog domain.

The transmitter 850 includes modulator 852, which modulates the analog information on connection 840 and provides a modulated signal via connection 858 to upconverter 854. The upconverter 854 transforms the modulated signal on connection 858 to an appropriate transmit frequency and provides the upconverted signal to the power amplifier module 202 via connection 884. The power amplifier module 202 contains one or more power amplifiers that amplify the signal to an appropriate power level for the system in which the portable transceiver 800 is designed to operate. Details of the structure and operation of the power amplifier module 202 are described below.

Details of the modulator 852 and the upconverter 854 have been omitted, as they will be understood by those skilled in the art. For example, the data on connection 840 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation applications, such as the global system for mobile communications (GSM), the phase-modulated information is provided by the modulator 852. When the power amplifier module is used in an application requiring both phase and amplitude modulation such as, for example, extended data rates for GSM evolution, referred to as EDGE, the cartesian in-phase (I) and quadrature (Q) components of the transmit signal are converted to their polar counterparts, amplitude and phase. The phase-modulation is performed by the modulator 852, while the amplitude modulation is performed by elements of a power amplifier control element, where the amplitude envelope is defined by a power amplifier power control voltage $V_{APC}$, which is generated by the power amplifier control element. The instantaneous power level of the power amplifier module 202 tracks $V_{APC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier module 202 supplies the amplified signal via connection 856 to a front end module 862. The front end module 862 comprises an antenna system interface that may include, for example, a diplexer having a filter pair that allows simultaneous passage of both transmit signals and receive signals, as known to those having ordinary skill in the art. In an embodiment, the power amplifier module 202 and the front end module 862 may be combined into a single element. The transmit signal is supplied from the front end module 862 to the antenna 216.

A signal received by antenna 216 will be directed from the front-end module 862 to the receiver 870. The receiver 870 includes a downconverter 872, a filter 882, and a demodulator 878. If implemented using a direct conversion receiver (DCR), the downconverter 872 converts the received signal from an RF level to a baseband level (DC). Alternatively, the received RF signal may be downconverted to an intermediate frequency (IF) signal, depending on the application. The downconverted signal is sent to the filter 882 via connection 874. The filter comprises a least one filter stage to filter the received downconverted signal as known in the art.

The filtered signal is sent from the filter 882 via connection 876 to the demodulator 878. The demodulator 878 recovers the transmitted analog information and supplies a signal representing this information via connection 886 to the ADC 834. The ADC 934 converts these analog signals to a digital signal at baseband frequency and transfers the signal via bus 828 to DSP 826 for further processing.

The method and apparatus described herein would be utilized in the power amplifier 202 and the baseband system 810. The baseband subsystem 810, such as the ASCI 835 or other processing device, may provide control signals to the receiver power amplifier module 202.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method comprising:
    monitoring a supply voltage presented to an amplifier having a gain level and being adapted to selectively operate in one of either a saturated mode or a linear mode;
    setting the gain level of the amplifier to a first gain level;
    setting the gain level of the amplifier to a second gain level, which is less than the first gain level, when the monitored supply voltage is less than a first threshold voltage; and
    setting the gain level of the amplifier to the first gain level when the monitored supply voltage exceeds a second threshold voltage the second threshold voltage being greater than the first threshold voltage.

2. The method of claim 1 wherein the supply voltage is sourced from a battery.

3. The method of claim 1 wherein the gain level of the amplifier is at least in part controlled by an amount of degeneration resistance coupled to a transistor in the amplifier.

4. The method of claim 1 wherein the method executes on a processor configured to execute software stored in a memory.

5. The method of claim 1 wherein when the supply voltage is less than the first threshold voltage, the amplifier fails to meet adjacent channel power ratio or error vector magnitude signal quality requirements.

6. The method of claim 1 wherein the amplifier is a power amplifier implemented in a transmitter adapted to transmit in bursts and the gain level of the amplifier is changed only between bursts.

7. The method of claim 6 wherein the monitoring of the supply voltage occurs only during bursts.

8. The method of claim 1 further comprising setting the gain level of the amplifier to a third gain level when the amplifier is operating in the saturated mode, the third gain level being greater than the first gain level.

9. The method of claim 1 wherein the gain level of the amplifier is selected from the group consisting of only the first gain level and the second gain level when operating in the linear mode.

10. The method of claim 1 wherein the amplifier is a power amplifier implemented in a transmitter adapted to transmit in bursts and the mode of the amplifier is changed only between bursts.

11. The method of claim 1 wherein the amplifier is implemented in a transmitter and monitoring of the supply voltage occurs only when transmitting.

12. A communication system comprising:
    a transceiver configured to generate an RF signal;
    a battery configured to provide a supply voltage;
    an amplifier having a gain level that controls amplification of the RF signal to create an amplified RF signal for transmission by an antenna;
    a detector configured to compare the supply voltage to at least a first threshold value and responsive to the comparison, generate one or more gain control signals which change the gain level of the amplifier from a first gain level to a second gain level; and
    a latching device disposed between the detector and the amplifier the latching device adapted to change the gain level of the amplifier only during periods when the communication system is not transmitting.

13. The system of claim 12 wherein the detector is further configured to compare the supply voltage to at least a second threshold value and, responsive to supply voltage being greater than the second threshold value, change the gain level to the first gain level.

14. The system of claim 12 further comprising one or more switching transistors controlled by the one or more gain control signals, the one or more switching transistors configured to selectively switch one or more resistors into or out of a circuit associated with the amplifier.

15. The system of claim 12 wherein the amplifier includes one or more bipolar amplifier transistors and one or more switches responsive to the one or more gain control signals to change a degeneration resistance.

16. The system of claim 12 wherein the amplifier includes:
    one or more field-effect transistors;
    a degeneration resistance disposed in series with a source terminal of the one or more field-effect transistors; and
    one or more switches responsive to the one or more gain control signals to control the gain level of the amplifier by changing the degeneration resistance within the amplifier.

17. The system of claim 12 wherein the amplifier includes a first amplifier stage having a first gain and a second amplifier stage having a second gain and the gain level of the amplifier is controlled by substituting the first amplifier stage with the second amplifier stage.

18. The system of claim 12 wherein the detector is a processor configured to execute software stored in a machine-readable medium.

19. The system of claim 12 wherein when the supply voltage drops below the first threshold value, the amplifier fails to meet adjacent channel power ratio or error vector magnitude signal quality requirements.

20. The system of claim 12 further comprising a memory configured to store the first threshold value, the memory being readable by the detector.

21. The system of claim 12 wherein the detector is a comparator.

22. An amplifier gain control system comprising:
    an amplifier module having a gain that is controlled at least in part by a gain control signal;
    a memory configured to store at least one threshold value;
    a comparator configured to compare a supply voltage to the at least one threshold value and, responsive to the comparison, generate the gain control signal; and
    a latching device configured to: receive a transmit enable signal and the gain control signal, and present a change in the gain control signal to the amplifier module only when the amplifier module is not amplifying a signal for transmission.

23. The system of claim 22 wherein the at least one threshold value includes a first threshold value and a second threshold value.

24. The system of claim 22 wherein the gain control signal decreases the gain in response to the supply voltage being less than a first threshold.

25. The system of claim 22 wherein the latching device is a flip-flop.

26. The system of claim 22 further comprising a gain control circuit that is responsive to the gain control signal to increase and decrease a resistance in the amplifier module to change the gain of the amplifier module.

27. The system of claim 22 wherein the supply voltage is sourced from a battery and the supply voltage changes over time.

28. A communication system comprising:
 a transceiver configured to generate an RF signal;
 a battery configured to provide a supply voltage;
 an amplifier having a gain level that controls amplification of the RF signal to create an amplified RF signal for transmission by an antenna;
 a detector configured to compare the supply voltage to at least a first threshold value and responsive to the comparison, generate one or more gain control signals which change the gain level of the amplifier from a first gain level to a second gain level; and
 one or more switching transistors controlled by the one or more gain control signals the one or more switching transistors configured to selectively switch one or more resistors into or out of a circuit associated with the amplifier, such that the switching occurs in response to the comparison of the supply voltage to the at least the first threshold.

29. The system of claim 28 wherein the detector is further configured to compare the supply voltage to at least a second threshold value and, responsive to the supply voltage being greater than the second threshold value, change the gain level to the first gain level.

30. The system of claim 28 wherein the detector is a processor configured to execute software stored in a machine-readable medium.

31. The system of claim 28 further comprising a memory configured to store the first threshold value, the memory being readable by the detector.

32. The system of claim 28 wherein the detector is a comparator.

* * * * *